(12) United States Patent
Veca et al.

(10) Patent No.: US 10,737,549 B2
(45) Date of Patent: Aug. 11, 2020

(54) TUBE MADE OF ELASTOMERIC MATERIAL FOR A SYSTEM WHICH IS ON-BOARD OF A MOTOR-VEHICLE

(71) Applicant: C.R.F. Società Consortile per Azioni, Orbassano (Turin) (IT)

(72) Inventors: Antonino Domenico Veca, Casalborgone (IT); Paolo Chiappero, Cavour (IT); Francesca Dalmasso, Turin (IT); Vito Guido Lambertini, Giaveno (IT)

(73) Assignee: C.R.F. Società Consortile per Azioni, Orbassano (Turin) (IT)

( * ) Notice: Subject to any disclaimer, the term of this patent is extended or adjusted under 35 U.S.C. 154(b) by 401 days.

(21) Appl. No.: 15/830,983

(22) Filed: Dec. 4, 2017

(65) Prior Publication Data
US 2018/0304721 A1 Oct. 25, 2018

(30) Foreign Application Priority Data
Apr. 21, 2017 (EP) .................................... 17167493

(51) Int. Cl.
*B60H 1/00* (2006.01)
*F16L 11/127* (2006.01)
*B23K 26/00* (2014.01)
*F16L 33/207* (2006.01)
*H05K 3/10* (2006.01)
(Continued)

(52) U.S. Cl.
CPC ..... *B60H 1/00585* (2013.01); *B23K 26/0006* (2013.01); *B60H 1/00557* (2013.01);
(Continued)

(58) Field of Classification Search
CPC ............ B60H 1/00585; B60H 1/00571; B60H 1/00557; F16L 33/2076; F16L 25/01;
(Continued)

(56) References Cited

U.S. PATENT DOCUMENTS 3,367,370 A * 2/1968 Sherlock ................. F16L 9/125
138/104
4,592,229 A * 6/1986 Butefisch .................. G01L 9/12
73/147
(Continued)

FOREIGN PATENT DOCUMENTS

EP 2921242 A1 9/2015
WO 2012/055934 A1 5/2012

OTHER PUBLICATIONS

European Search Report dated Oct. 9, 2017 for corresponding EP Application No. 17167493.0.

*Primary Examiner* — James M Hewitt, II
(74) *Attorney, Agent, or Firm* — Heslin Rothenberg Farley & Mesiti P.C.; Victor A. Cardona, Esq.

(57) ABSTRACT

A tube of elastomeric material for an air conditioning system or for other system which is on-board of a motor-vehicle is intended to be fitted over a metal connecting element and to be locked onto the latter by means of a crimping operation that envisages the clamping around the tube of a metal clamping element. The tube includes at least one body made of polymeric elastomeric material supplemented with carbon-based nanofillers wherein an outer surface with one or more piezo-resistive areas is provided, where the polymeric material supplemented with carbon-based nanofillers has been made locally piezo-resistive by means of laser irradiation. The piezo-resistive areas arranged on the body of polymeric elastomeric material of the tube can be used for verifying the correct execution of the crimping operation.

7 Claims, 5 Drawing Sheets

(51) Int. Cl.
*H05K 1/03* (2006.01)
*F16L 25/01* (2006.01)

(52) U.S. Cl.
CPC ........ *B60H 1/00571* (2013.01); *F16L 11/127* (2013.01); *F16L 25/01* (2013.01); *F16L 33/2071* (2013.01); *F16L 33/2076* (2013.01); *H05K 1/0393* (2013.01); *H05K 3/105* (2013.01); *F16L 2201/10* (2013.01); *H05K 2201/0133* (2013.01); *H05K 2201/10151* (2013.01)

(58) Field of Classification Search
CPC ...... F16L 33/2071; F16L 11/127; F16L 11/12; H05K 1/0393; H05K 3/105; B23K 26/0006

See application file for complete search history.

(56) References Cited

U.S. PATENT DOCUMENTS

| | | | | |
|---|---|---|---|---|
| 5,317,923 A | * | 6/1994 | Erichsen | G01L 9/0052 338/4 |
| 7,303,022 B2 | * | 12/2007 | Tilton | E21B 4/02 166/242.1 |
| 8,783,732 B2 | * | 7/2014 | Smith | F16L 25/01 285/256 |
| 2004/0129092 A1 | * | 7/2004 | Dietzel | F16L 41/008 73/865.9 |
| 2007/0164562 A1 | * | 7/2007 | Valaskovic | B01L 3/565 285/245 |
| 2011/0181038 A1 | | 7/2011 | Galle et al. | |
| 2015/0252928 A1 | * | 9/2015 | Wells | F16L 33/2073 285/257 |
| 2017/0089496 A1 | | 3/2017 | Lennon | |

* cited by examiner

TUBE MADE OF ELASTOMERIC MATERIAL FOR A SYSTEM WHICH IS ON-BOARD OF A MOTOR-VEHICLE

CROSS REFERENCE TO RELATED APPLICATIONS

This application claims priority to European Patent Application No. 17167493.0 filed on Apr. 21, 2017, the entire disclosure of which is incorporated herein by reference.

This application is also related to U.S. Ser. No. 15/830,960, filed concurrently herewith, entitled "SEALING FOR MOTOR-VEHICLES WITH INTEGRATED ANTI-PINCHING SYSTEM".

This application is also related to U.S. Ser. No. 15/830,971, filed concurrently herewith, entitled "ELASTIC SUPPORT WITH AN INTEGRATED LOAD SENSOR FOR SUSPENSION SYSTEMS OF A MOTOR-VEHICLE".

FIELD OF THE INVENTION

The present invention relates to tubes made of elastomeric material for systems which are on-board of motor-vehicles, intended to be fitted over a metal connecting element, and to be locked onto the latter by means of a metal clamping element, which is clamped around the tube with a crimping operation.

PRIOR ART

Crimping is a method known per se, which is used to connect a tube of elastomeric material or the like to a connecting element of metal material arranged for connection to the components of an on-board system of a motor-vehicle (for example, for connecting to a compressor of an air-conditioning system), in order to ensure the sealing of a fluid circulating within the tubes.

Incorrect crimping due to, for example, an insufficient crushing pressure of the metal clamping element, can cause leakage of the fluid under pressure that circulates within the tubes during the operating steps of the system.

To ensure that crimping is performed correctly, solutions currently available on the market do not provide an automatic validation control, but use a visual dimensional objectification carried out manually on statistical samples, by means of an inspection hole arranged on the metal clamping element.

Various solutions of pipe fittings including various types of detecting means are known from US 2011/181038 A1, US 2017/0089496 A1 and EP 2921242 A1.

The same Applicant has proposed, in the document WO 2012/055934 A1, a method for producing conductive and/or piezo-resistive traces in a non-conductive polymeric substrate, by means of laser irradiation, wherein said substrate is a composite polymeric material, comprising a matrix with a polymer unsusceptible to carbonization following thermal degradation, and a dispersed step comprising carbon nanotubes or carbon nitride or carbon nanofibers.

The present invention builds on the requirement to find an advantageous application of this method, in order to produce a tube for motor-vehicle systems with an integrated pressure sensor to automatically verify the correct execution of the crimping operation on tubes of elastomeric material for a motor-vehicle system.

OBJECT OF THE INVENTION

One object of the present invention is therefore to produce a tube of elastomeric material for a system which is on-board of a motor-vehicle, which exploits the possibilities offered by the method proposed by the Applicant in the document WO 2012/055934 A1, in an advantageous manner.

An additional object of the invention is to achieve the aforesaid objective through a tube with an integrated pressure sensor to ensure, without any margin of error, the correct execution of the crimping operation on the tube.

Another object of the invention is to produce a tube for motor-vehicle systems that is simple and economical to construct and, at the same time, is extremely reliable in carrying out the functions for which it is predisposed.

SUMMARY OF THE INVENTION

In view of achieving the aforesaid objects, the present invention aims to provide a tube of elastomeric material having all the characteristics indicated at the start of the present description, and also characterized in that said tube comprises at least one body formed of polymeric elastomeric material supplemented with carbon-based nanofillers, said body including:
  an outer surface with one or more piezo-resistive areas where said polymeric material supplemented with carbon-based nanofillers has been made locally piezo-resistive by laser irradiation, so as to define one or more electric deformation sensors configured to detect the pressure exerted above said piezo-resistive areas,
  one or more conductive paths where said polymeric material supplemented with carbon-based nanotubes has been made locally electrically conductive by laser irradiation, so as to define one or more electrical connection lines of said one or more piezo-resistive areas, wherein electrodes may be associated with said body,
  in such a way that said piezo-resistive areas can be used to verify the correct execution of said crimping operation.

Thanks to the characteristics indicated above, the tube of elastomeric material for motor-vehicle systems according to the present invention integrates the automatic control function within the component itself, to ensure that crimping is performed correctly, without having to resort to unreliable visual controls.

In a first embodiment of the invention, the piezo-resistive areas are connected to each other in series, while in a second embodiment, the piezo-resistive areas are connected to each other in parallel.

The present invention is also directed at a motor-vehicle, comprising at least one tube of the type indicated above, and an electronic control unit configured to monitor the electrical resistance of the electrically-conductive paths including the said piezo-resistive areas, and to generate an alarm signal when the measured electrical resistance deviates from a predetermined threshold value.

Furthermore, the present invention is also directed at a method for verifying the correct execution of a crimping operation on a tube of elastomeric material for air conditioning systems or other on-board systems of a motor-vehicle.

Further characteristics and advantages of the invention will become apparent from the following description and the attached claims.

DETAILED DESCRIPTION OF AN EMBODIMENT OF THE INVENTION

The attached drawings are provided purely by way of non-limiting example, wherein.

Figure 1:
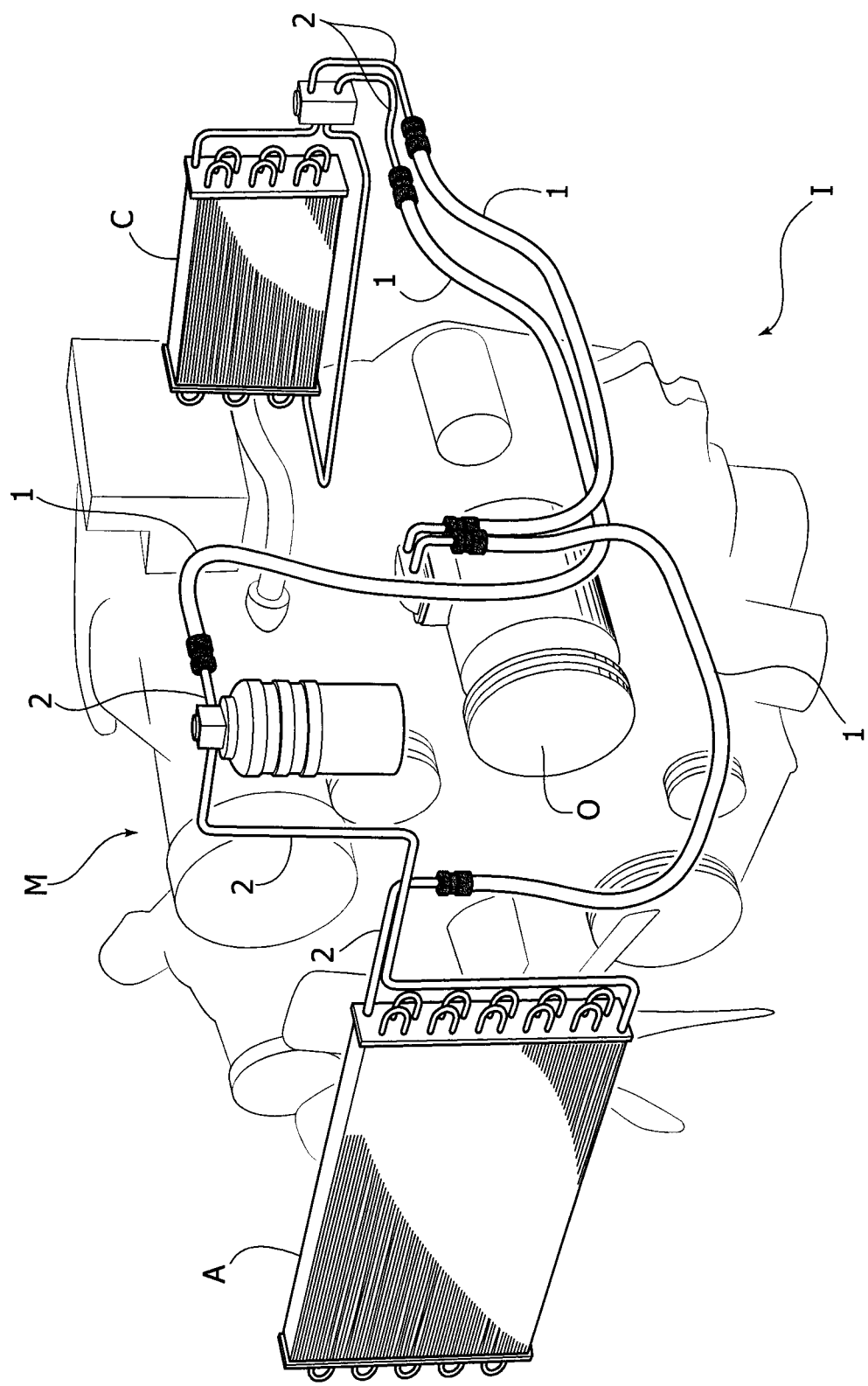
FIG. 1 is a schematic perspective view of an air conditioning system provided with a plurality of tubes of elastomeric material according to the present invention.

In the attached drawings, reference 1 indicates a preferred embodiment of a tube of elastomeric material according to the present invention, for an on-board system of a motor-vehicle. More specifically, FIG. 1 illustrates a schematic perspective view of an air conditioning system I associated with an internal combustion engine M of a motor-vehicle, comprising a plurality of tubes 1 according to the present invention.

According to an architecture known per se, the ends of the tubes 1 are fitted to a respective metal connecting element 2, the latter being connected, in turn, to components of the system I such as, for example, a radiator A, a compressor O and an evaporator C.

The constructive details of the air conditioning system I are not presented here, since these details can be implemented in any known way, and also because the removal of these details from the drawings makes them more readily and easily understood.

Therefore, the tubes according to the invention can also be associated with other types of motor-vehicle systems, such as a braking system, a fuel supply system or a steering system.

In addition, the specific embodiments of the tubes according to the invention illustrated in the drawings are not to be considered in any way limitative, since the present invention is also directed, for example, at tubes of other shapes and sizes.

Figure 2:
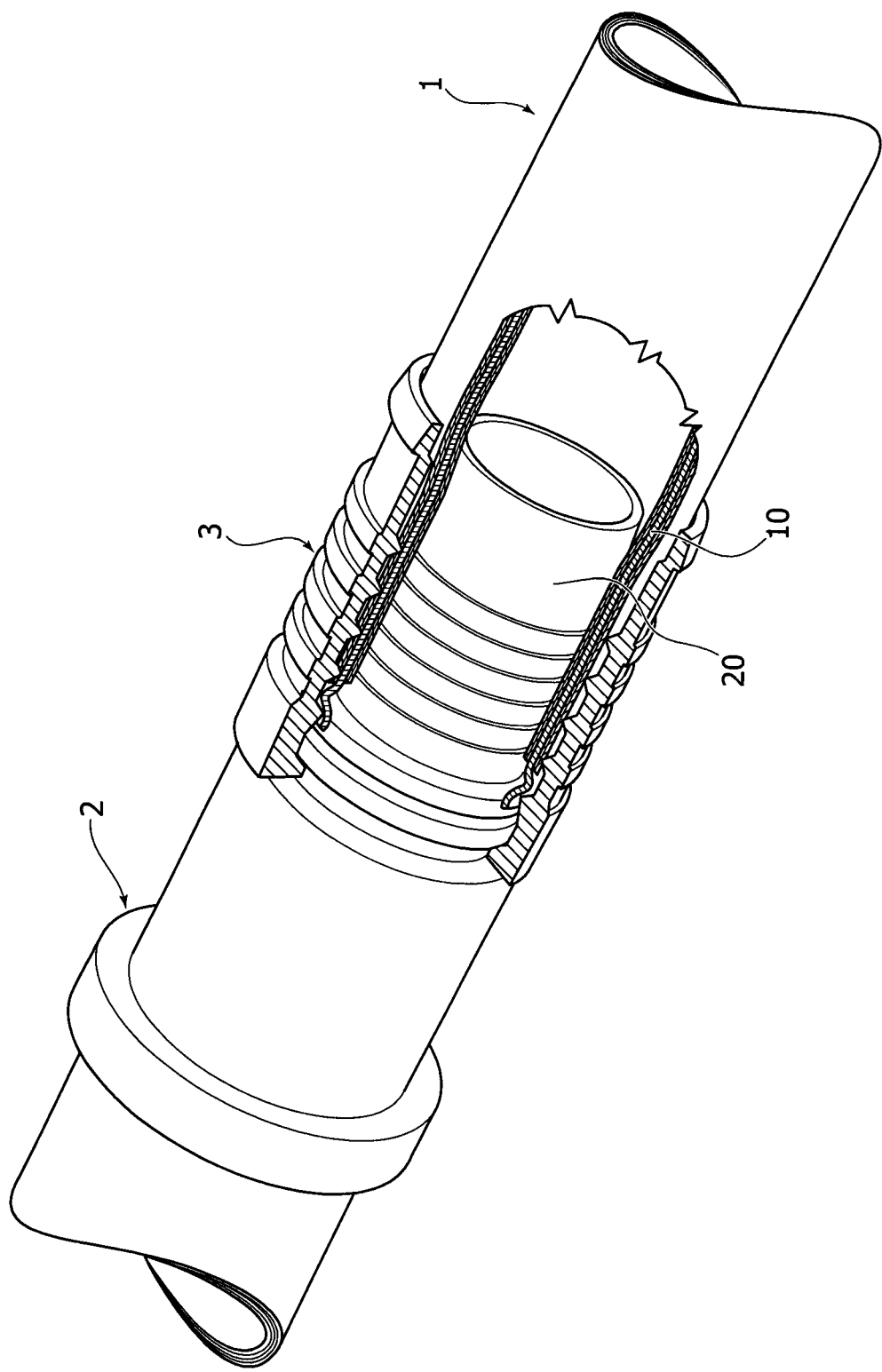
FIG. 2 illustrates a partially sectioned perspective view—on an enlarged scale—of a tube illustrated in the previous figures, previously crimped to a metal connecting element.

Referring particularly to FIG. 2, which illustrates a partially sectioned schematic perspective view—on an enlarged scale—of an end portion of a tube of elastomeric material according to the invention, the manner in which the tubes 1 are connected to the connecting elements 2 will now be described. The connecting element 2 has an end 20 having a diameter smaller than the diameter of the tube 1, in such a way that the end 10 of the tube 1 can be fitted around the end 20 of the metal connection 2.

In addition, in order to ensure the sealing of the connection between the tube 1 and the connection 2, according to a technique known per se, the tube 1 is locked onto the metal connection 2 by means of a crimping operation that involves the application of a metal clamping element 3 around the tube 1 at its end portion 10 fitted over the connection 2.

The crimping is a known method that specifically consists in ensuring the sealing of a tube, avoiding leakage of fluid circulating in the tubes 1, by means of applying a metal clamping element 3. As illustrated in the drawings, the annular-shaped metal clamping element 3 is arranged at the ends 10 of the tubes 1 fitted over the metal connections 2, which are, in turn, connected to the components A, B, O of the system I.

Figure 3:
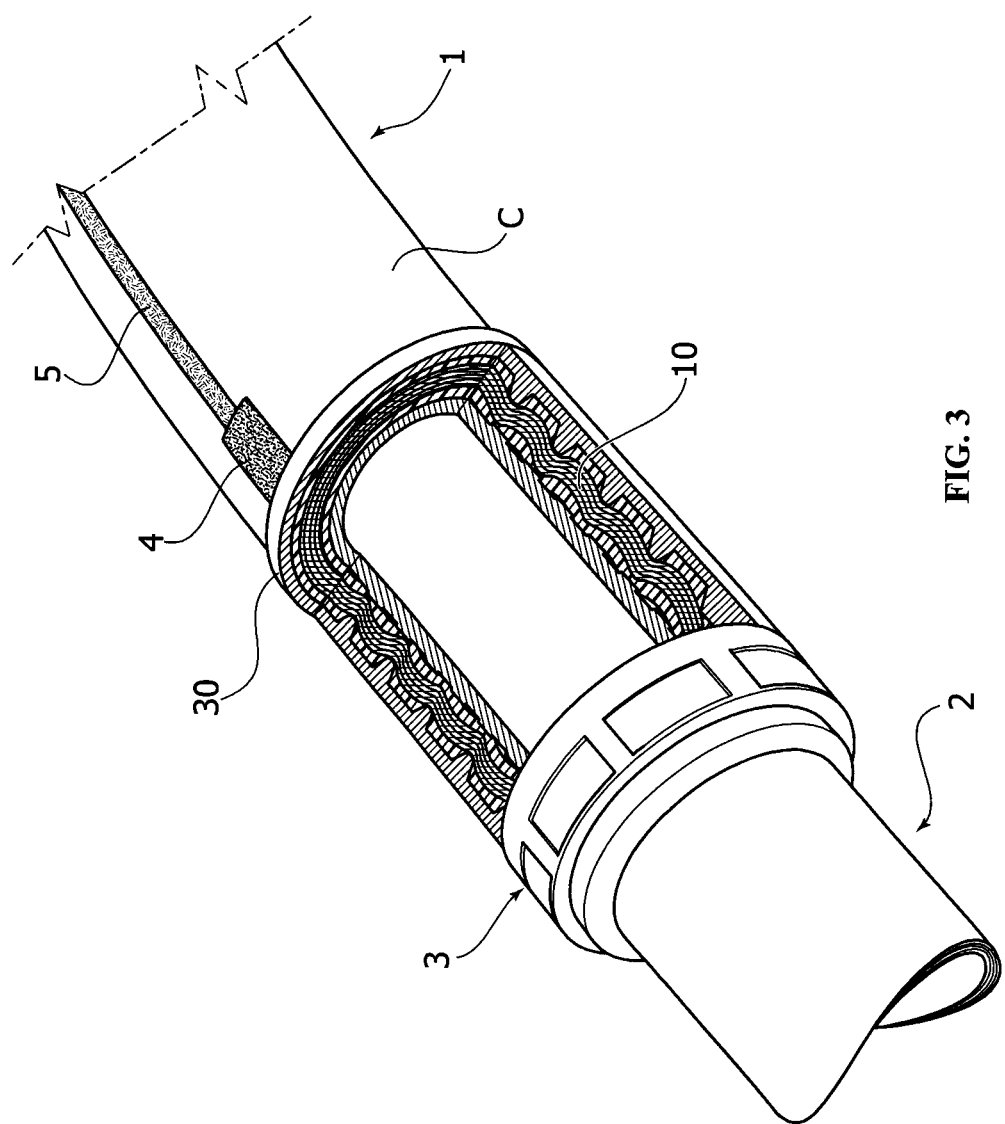
FIG. 3 illustrates another perspective view of the tube according to the present invention.
Figure 4:
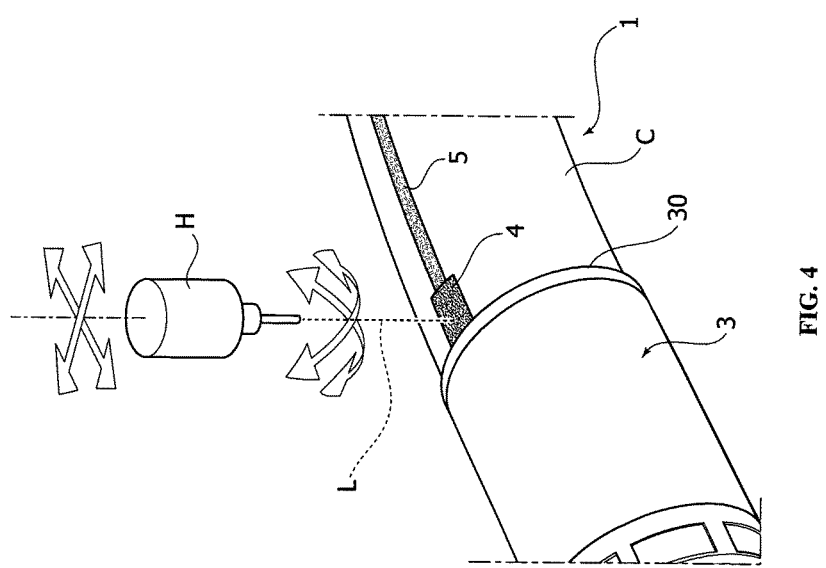
FIG. 4 is a schematic perspective view that illustrates a step of the production method of the tube according to the invention.
Figure 5:
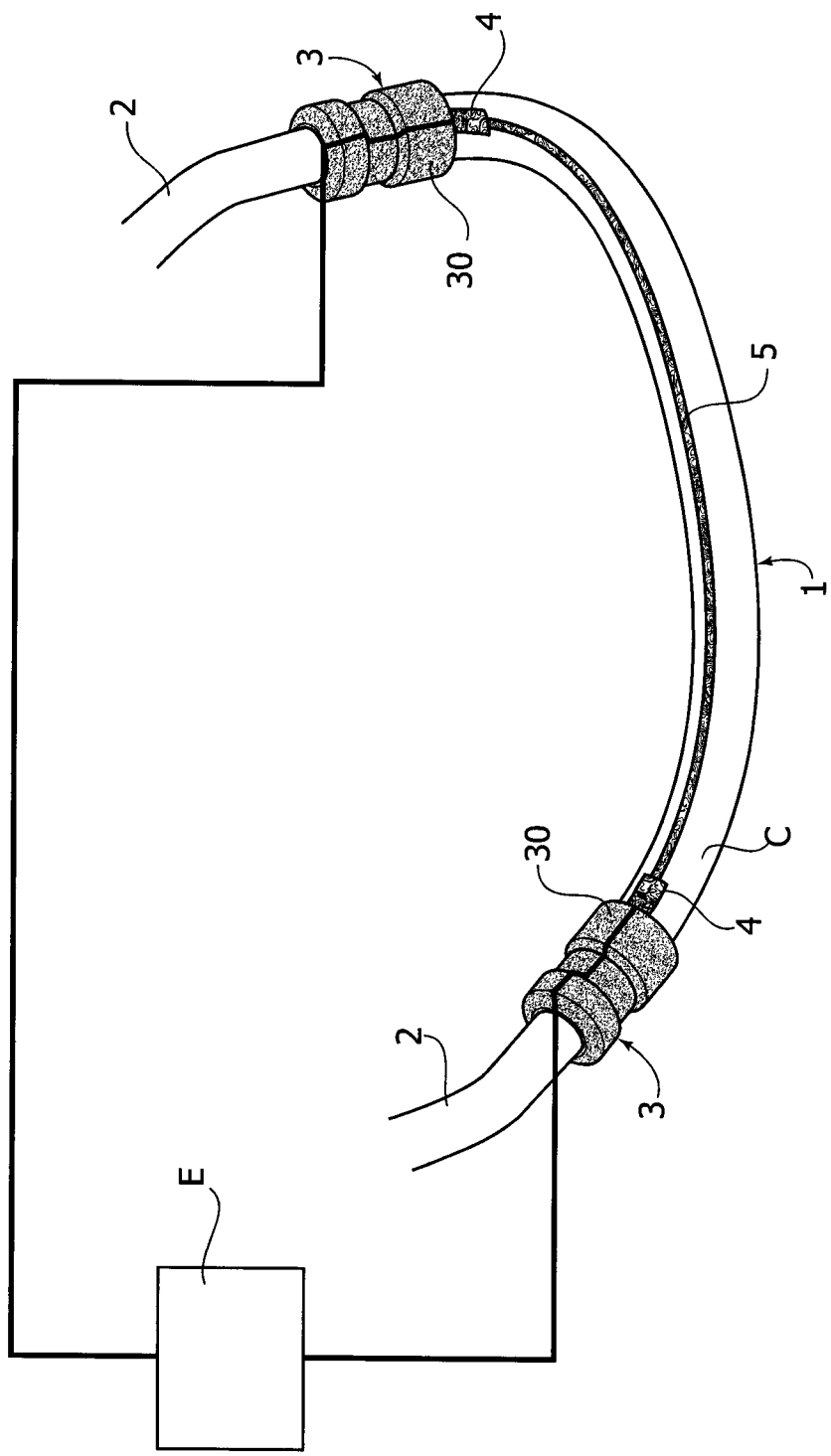
FIG. 5 is a schematic view of the tube illustrated in the preceding figures connected to an electronic control unit.

According to an essential characteristic of the present invention (illustrated in FIG. 3), the tube 1 comprises at least one body C formed of polymeric elastomeric material having functionalized portions consisting of a polymeric material supplemented with carbon-based nanofillers, according to the disclosures of the document WO2012/055934 A1 by the same Applicant (FIGS. 3-5).

In the known method of this document, a polymeric-based material is supplemented with carbon-based nanofillers, such as carbon nanotubes or carbon nitride or carbon nanofibers, in an amount insufficient to make the material electrically conductive.

In the embodiments of the invention illustrated in the drawings, and in particular with reference to FIGS. 3 and 4, which illustrate a tube 1 according to the present invention with its end 10 crimped to a connecting tube 2, a surface of the body C of this tube 1 is subjected to the known method known of WO2012/0559341 A1. This method envisages the directing of a laser beam L emitted by a laser head H over the polymeric material of the elastic support in order to form at least one piezo-resistive area 4.

FIG. 4 shows schematically a laser head H movable according to two orthogonal directions X, Y and also equipped with means for pivoting the laser beam L in one plane or two orthogonal planes. The solution schematically illustrated in FIG. 4 is provided purely as an indication, being possible to envisage that, alternatively, the tube 1 moves relative to the laser head H, or to envisage a combination of movements of the tube 1 and the laser head H.

According to another characteristic of the invention (FIGS. 3 and 4), the laser irradiation on the surface of the body C of the tube 1 is carried out in such a way as to form, in addition to the piezo-resistive areas 4, one or more electrically-conductive paths 5 where the laser beam L causes a carbonization of the material.

The details relative to the base material, the type of nanofillers, the type of usable laser, and the means for moving the laser head H are not illustrated here, for simplicity and clarity, since such details, taken in their own right, do not fall within the scope of the present invention and are achievable in any known manner, according to the disclosures contained in the document WO 2012/055934 A1.

Again with reference to FIG. 3, a portion 30 of the metal clamping element 3 is superimposed—at least partially—on the piezo-resistive area 4. Thanks to this arrangement, associated with the presence of the piezo-resistive areas 4, the portion 30 of the metal element 3 functions as an electrode and thus as a conductive metal terminal, connectable to an electronic control unit E provided on-board the motor vehicle on which the tubes according to the invention are mounted. In fact, according to a further characteristic of the invention, the ends 10 of the tubes 1 provided with the piezo-resistive areas 4 are connected by means of the electrodes to an electronic control unit E of the motor-vehicle (schematic view of FIG. 5), which is configured to monitor the electric resistance of the electrically-conductive paths 5 including the piezo-resistive areas 4, and to generate an alarm signal when the measured electrical resistance deviates from a predetermined threshold value.

Thanks to the provision of the piezo-resistor areas 4, the conductive paths 5 and the configuration of the control unit E as described above, the tube 1 for a motor-vehicle system according to the present invention has a pressure sensor integrated into the component itself, which guarantees the correct execution of the crimping operation in a totally reliable way. In the case in which the measured electrical resistance deviates from a predetermined threshold value due to, for example, an insufficient crushing pressure of the metal clamping element 3 on the tube 1, the alarm signal generated by the electronic control unit can be constituted, for example, by a warning lamp that lights up on the instrument panel arranged inside the car.

Of course, the arrangement and the shape of the piezo-resistive areas 4, the conductive paths 5 and the electrodes 30 on the outer surface of the tube 1, may vary widely with respect to what is illustrated, without prejudice to the operation of the tube 1 sensorized according to the invention.

Purely by way of example, in the specific form illustrated in the drawings, the conductive paths 5 are arranged in such a way that the piezo-resistive areas 4 are connected in series with each other by the conductive paths 5, but piezo-resistive areas 4 can also be provided with a different form, connected to each other in parallel. Furthermore, it is also possible to arrange the electrodes for connection to the electronic control unit along the body of the tube.

Thanks to the characteristics described above, the tube according to the present invention advantageously exploits the possibilities offered by the method proposed by the Applicant in the document WO2012/0559341 A1, by means of producing an object that is simple and economical to construct but, at the same time, being extremely reliable in detecting an incorrect crimping, so as to generate an alarm signal when the measured electrical resistance deviates from a predetermined threshold value.

Of course, without prejudice to the principle of the invention, the details of construction and the embodiments may vary widely with respect to those described and illustrated purely by way of example, without departing from the scope of the present invention as defined in the appended claims.

What is claimed is:

1. A tube assembly comprising:
    a tube made of elastomeric material for an air conditioning system or other system which is on-board of a motor-vehicle, intended to be fitted over a metal connecting element, and to be locked onto the latter by means of a metal clamping element that is clamped around said tube with a crimping operation, wherein said tube comprises at least one body formed of polymeric elastomeric material supplemented with carbon-based nanofillers, said body including:
        an outer surface with one or more piezo-resistive areas where said polymeric material supplemented with carbon-based nanofillers has been made locally piezo-resistive by laser irradiation, so as to define one or more electric deformation sensors configured to detect the pressure exerted above said piezo-resistive areas,
        one or more conductive paths where said polymeric material supplemented with carbon-based nanofillers has been made locally electrically-conductive by laser irradiation, so as to define one or more electrical connection lines of said one or more piezo-resistive areas, wherein electrodes may be associated with said body,
    in such a way that said piezo-resistive areas can be used to verify the correct execution of said crimping operation;
        said electrodes formed of end portions of said metal clamping element, said end portions arranged in contact with said piezo-resistive areas; and
    an electronic control unit configured to monitor the electrical resistance of one or more electrically-conductive paths including said piezo-resistive areas and to generate an alarm signal when the measured electrical resistance deviates from a predetermined threshold value.

2. A tube according to claim 1, wherein said tube has a larger diameter with respect to the diameter of the ends of said metal connecting element.

3. A tube according to claim 1, wherein a plurality of said piezo-resistive areas electrically is connected in series with each other by said conductive paths.

4. A tube according to claim 1, wherein a plurality of said piezo-resistive areas is electrically connected in parallel with each other by said conductive paths.

5. An air conditioning system which may be arranged on-board of a motor-vehicle, comprising a plurality of tubes according to claim 1 for connection to components of said system.

6. A motor-vehicle, comprising at least one tube according to claim 1, and an electronic control unit configured to monitor the electrical resistance of one or more electrically-conductive paths including said piezo-resistive areas and to generate an alarm signal when the measured electrical resistance deviates from a predetermined threshold value.

7. A method for verifying the correct execution of a crimping operation of a tube of elastomeric material for air conditioning systems or other on-board systems of a motor-vehicle, wherein said method comprises the steps of:
    providing a tube of elastomeric material, wherein said tube comprises at least one body formed of polymeric elastomeric material supplemented with carbon-based nanofillers, said body including:
        an outer surface with one or more piezo-resistive areas where said polymeric material supplemented with carbon-based nanofillers has been made locally piezo-resistive by laser irradiation, so as to define one or more electric deformation sensors configured to detect the pressure exerted above said piezo-resistive areas,
        one or more conductive paths where said polymeric material supplemented with carbon-based nanofillers has been made locally electrically-conductive by laser irradiation, so as to define one or more electrical connection lines of said one or more piezo-resistive areas wherein electrodes may be associated with said body,
    fitting said tube over a metal connecting element and locking it onto the latter by means of a metal clamping element which is clamped around said tube with a crimping operation,
    in such a way that said piezo-resistive areas can be used to verify the correct execution of said crimping operation.

* * * * *